US011270818B2

(12) United States Patent
Mortain et al.

(10) Patent No.: US 11,270,818 B2
(45) Date of Patent: Mar. 8, 2022

(54) ELECTRICAL EQUIPMENT INCLUDING AN INSULATING FILM FOLDED ON ITSELF

(71) Applicant: Valeo Siemens eAutomotive France SAS, Cergy (FR)

(72) Inventors: Eloi Mortain, Surenes (FR); Alwin Moceri, Conflans Sainte-Honorine (FR); Baptiste Parigot, Croissy-sur-Seine (FR)

(73) Assignee: VALEO SIEMENS EAUTOMOTIVE FRANCE SAS, Cergy (FR)

( * ) Notice: Subject to any disclaimer, the term of this patent is extended or adjusted under 35 U.S.C. 154(b) by 19 days.

(21) Appl. No.: 16/710,199

(22) Filed: Dec. 11, 2019

(65) Prior Publication Data

US 2020/0194147 A1 Jun. 18, 2020

(30) Foreign Application Priority Data

Dec. 14, 2018 (FR) ........................... 1872986

(51) Int. Cl.
| | |
|---|---|
| *H01B 17/62* | (2006.01) |
| *H05K 5/02* | (2006.01) |
| *H01G 2/10* | (2006.01) |
| *H02M 7/00* | (2006.01) |
| *H02J 7/00* | (2006.01) |

(52) U.S. Cl.
CPC ............ *H01B 17/62* (2013.01); *H01G 2/10* (2013.01); *H02J 7/0042* (2013.01); *H02M 7/003* (2013.01); *H05K 5/0247* (2013.01)

(58) Field of Classification Search
CPC ......... H01B 17/62; H01G 2/10; H02J 7/0042; H02M 7/003; H05K 5/0247
USPC ....................................................... 361/329
See application file for complete search history.

(56) References Cited

U.S. PATENT DOCUMENTS

| 3,636,237 A * | 1/1972 | Hafer .................. H02G 5/06 174/68.3 |
| 5,422,440 A * | 6/1995 | Palma .................. H02G 5/005 174/133 B |

(Continued)

FOREIGN PATENT DOCUMENTS

| EP | 1788596 A1 | 5/2007 |
| EP | 2928059 A1 | 10/2015 |

OTHER PUBLICATIONS

French Search Report for Application No. 1872986 dated Oct. 11, 2019.

*Primary Examiner* — Anatoly Vortman
(74) *Attorney, Agent, or Firm* — McCormick, Paulding & Huber PLLC (57) ABSTRACT

The subject-matter of the invention is an electrical device comprising:
- a casing comprising a cavity receiving an electrical component, and
- at least two conductors connected to the electrical component so as to supply it with electric energy, both conductors being superimposed with each other and extending in parallel,
- said device being characterised in that it comprises an electric insulating film folded on itself around a fold, and a first part of which located on a side of the fold comes against a surface of the first conductor so as to electrically insulate it, and a second part of which located on the other side of the fold is inserted between both conductors so as to electrically insulate them from each other.

16 Claims, 6 Drawing Sheets

(56) References Cited

U.S. PATENT DOCUMENTS

| | | | | |
|---|---|---|---|---|
| 7,978,468 B2 * | 7/2011 | Nakatsu | ............... | H02M 7/003 |
| | | | | 361/689 |
| 10,109,422 B2 * | 10/2018 | Koyama | ............... | H01G 4/002 |
| 10,177,675 B2 * | 1/2019 | Numakura | ............ | H02M 7/003 |
| 10,658,110 B2 * | 5/2020 | Parigot | ............... | H01G 13/003 |
| 10,717,366 B1 * | 7/2020 | Jaksic | ................... | B60M 1/30 |
| 10,910,134 B2 * | 2/2021 | Moceri | .................. | B60L 50/51 |
| 2006/0232942 A1 * | 10/2006 | Nakatsu | ................ | B60L 50/16 |
| | | | | 361/710 |
| 2009/0059467 A1 * | 3/2009 | Grimm | ................ | H01G 4/224 |
| | | | | 361/301.5 |
| 2011/0304948 A1 * | 12/2011 | Lee | .................... | H05K 7/1432 |
| | | | | 361/301.1 |
| 2014/0321090 A1 * | 10/2014 | Guerin | .................... | H01G 9/26 |
| | | | | 361/782 |
| 2015/0155692 A1 | 6/2015 | Hwang et al. | | |
| 2018/0019062 A1 * | 1/2018 | Okuzuka | ................ | H01G 2/04 |
| 2018/0027646 A1 * | 1/2018 | Sumida | ................ | H05K 7/209 |
| | | | | 361/720 |
| 2018/0358903 A1 | 12/2018 | Takahashi et al. | | |

\* cited by examiner

ELECTRICAL EQUIPMENT INCLUDING AN INSULATING FILM FOLDED ON ITSELF

CROSS-REFERENCE TO RELATED APPLICATION

This application claims foreign priority benefits under 35 U.S.C. § 119 to French Patent Application No. 1872986 filed on Dec. 14, 2018, the content of which is hereby incorporated by reference in its entirety.

TECHNICAL FIELD

The present invention relates to an electrical device having an improved electrical insulating system and an electrical equipment comprising such an electrical device, in particular a voltage converter, or an electric charger or a power inverter.

The electrical equipment is in particular configured to an electric or hybrid vehicle.

The purpose of the invention is in particular to allow a durable electric insulation for such electrical devices.

BACKGROUND

As is known, in an electric or hybrid motor vehicle, a high voltage power battery provides an electric energy supply function for an electric motor system enabling the vehicle to be driven. More precisely, in order to control the electric machine driving the wheels of the vehicle, it is known to use a power inverter enabling the direct current provided by the high voltage power battery to be converted into one or more alternating, for example sinusoidal, control currents.

Furthermore, in order to be charged, the high voltage power battery is for example connected to an external electric power grid, especially through an onboard electric charger especially comprising at least one DC-DC voltage converter.

The inverter comprises a housing, dedicated to this equipment. The inverter also comprises a capacitive block comprising a casing adapted to be inserted into the housing of the power inverter. The capacitive block also comprises a cavity, located inside the casing, and a smoothing capacitor, adapted to be inserted into the cavity of the casing. The capacitive block enables the direct current provided by the power battery to be smoothed, before being converted into an alternating control current. This capacitor thus enables the residual disturbances of the direct current to be removed so that it can be filtered and converted into an alternating control current.

The capacitive block also comprises at least two conductors, in particular a conductor connected to the negative terminal of the capacitor and a conductor connected to the positive terminal of the capacitor. Each conductor is in the form of a folded copper foil for example. These conductors thus make it possible to allow simple access to the negative and positive terminals of the capacitor, in order to simply connect the capacitor to the rest of the system.

However, conductors are disposed along distinct parallel planes, but in the proximity of each other. Thus, an insulation has to be provided between the conductors and also between the conductors and the housing in order to insulate these elements from each other to avoid any short-circuit risk which could prevent an optimal operation of the power inverter.

According to the state of the art, a first solution consists in using a first insulating film to be placed between the conductors and the housing and a second insulating film to be placed between the conductors. According to this solution, the first and the second insulating film are held stationary especially by being attached with an adhesive material, such as glue.

However, any adhesive material has a very limited lifetime which is much lower than the lifetime of a vehicle of any sort. It is thus possible that the adhesive material deteriorates over time and that short-circuit problems occur.

There is therefore a need for an efficient durable solution for a system for attaching insulating elements of different elements of an electrical equipment, in particular of a capacitive block.

SUMMARY

More precisely, the object of the invention is an electrical device comprising:

a casing comprising a cavity receiving an electrical component, and at least two conductors connected to the electrical component so as to supply it with electric energy, both conductors being superimposed with each other and extending in parallel, said device being characterised in that it comprises an electric insulating film folded on itself around a fold, and a first part of which located on a side of the fold lies against a surface of the first conductor so as to electrically insulate it, and a second part located on the other side of the fold is inserted between both conductors so as to electrically insulate them from each other, the second part of the electric insulating film coming against another surface of the first conductor opposite to the surface of the first conductor receiving the first part of the electric insulating film.

Preferably, the fold of the electric insulating film of the electrical device comprises at least one aperture adapted to allow free access to the conductors.

Advantageously, the first part and the second part of the electric insulating film of the electrical device each have at least one protrusion inserted into the cavity of the casing and embedded into the filling material of the cavity of the casing.

Advantageously, the electrical device forms a capacitive block and the electrical component is a capacitive element.

Preferably, according to one embodiment, the first part of the electric insulating film of the electrical device is folded so as to fit the surface of the first conductor and is held against said surface of the first conductor only through the at least one protrusion and the fold.

Preferably, according to another embodiment, the first part of the electrical device is held on the surface of the first conductor through an adhesive material.

Advantageously, the electric insulating film is made of plastic.

The invention also relates to an electrical equipment comprising a housing and the electrical device according to the previous description housed into said housing, the first part of the electric insulating film electrically insulating the first conductor from other components of the electrical equipment located in said housing of the electrical equipment, the second part of the electric insulating film insulating the conductors from each other.

BRIEF DESCRIPTION OF THE FIGURES

The invention will be better understood upon reading the following description, given only by way of example, and with reference to the appended drawings given by way of non-limiting examples, wherein identical references are given to similar objects and in which.

It should be noted that the figures set out the invention in further detail to implement the invention, wherein said figures can of course be used to better define the invention if necessary.

DETAILED DESCRIPTION

In the description which will be made below, the invention will be in particular described in the context of an electrical equipment, such as a power inverter, configured for an electric or hybrid motor vehicle, without this being restrictive of the scope of the present invention.

Indeed, in an electric or hybrid motor vehicle, the high voltage power battery provides the electric energy supply function of the electric motor system, enabling the vehicle to be driven, especially through a power inverter enabling the DC current provided by the high voltage power battery to be converted into one or more alternating, for example sinusoidal, control currents.

Figure 1:
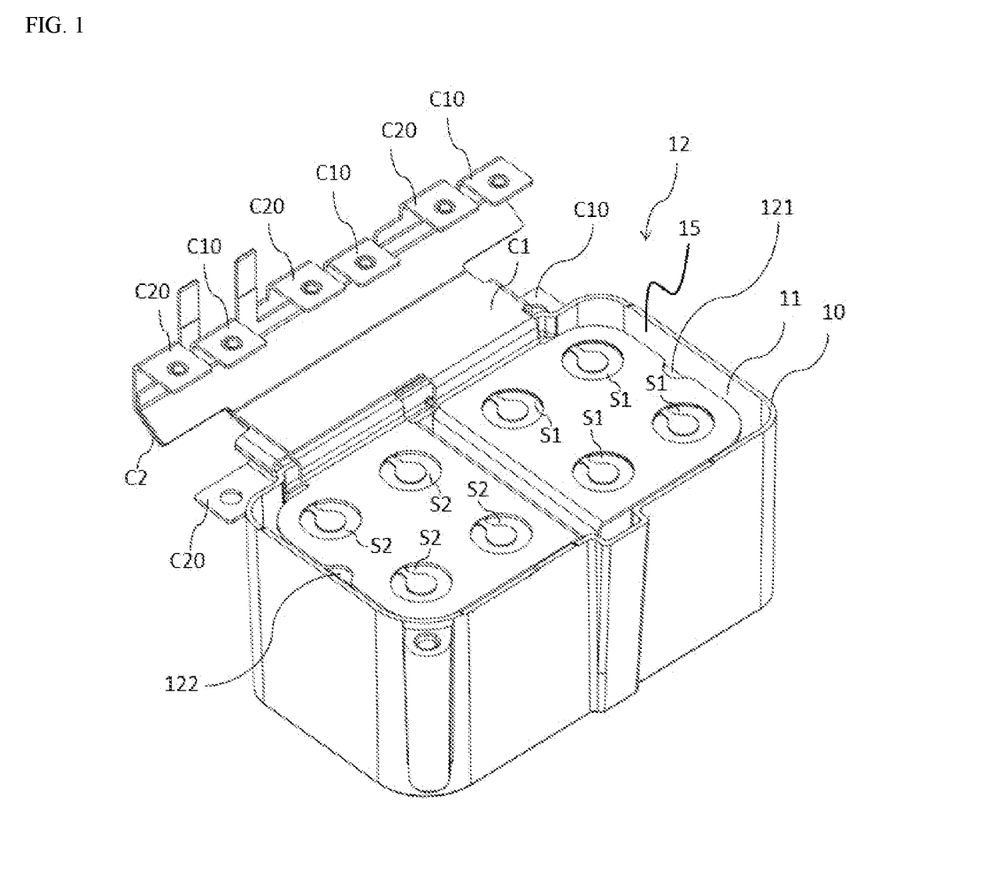
FIG. 1 illustrates the scheme of a capacitive block.

With reference to FIG. 1, the electrical equipment comprises a housing, dedicated to it. In the present case, this electrical equipment is a power inverter. The inverter comprises a capacitive block 12 comprising a casing 10 adapted to be inserted into the housing. The capacitive block 12 also comprises a cavity 11, located inside the casing 10, in particular defined by the casing 10. The capacitive block 12 further comprises capacitive elements 121, 122, adapted to be inserted into the cavity 11 of the casing 10. The capacitive block 12 enables the direct current provided by the power battery to be smoothed, before being converted into an alternating control current. This capacitive block 12 comprising a positive terminal and a negative terminal, thus enables the residual disturbances of the direct current to be removed so that it can be filtered and converted into an alternating control current, especially by electronic switches which are not represented. The capacitive elements 121, 122 are for example chemical capacitors or film capacitors, or any other type of capacitive element.

Figure 2:
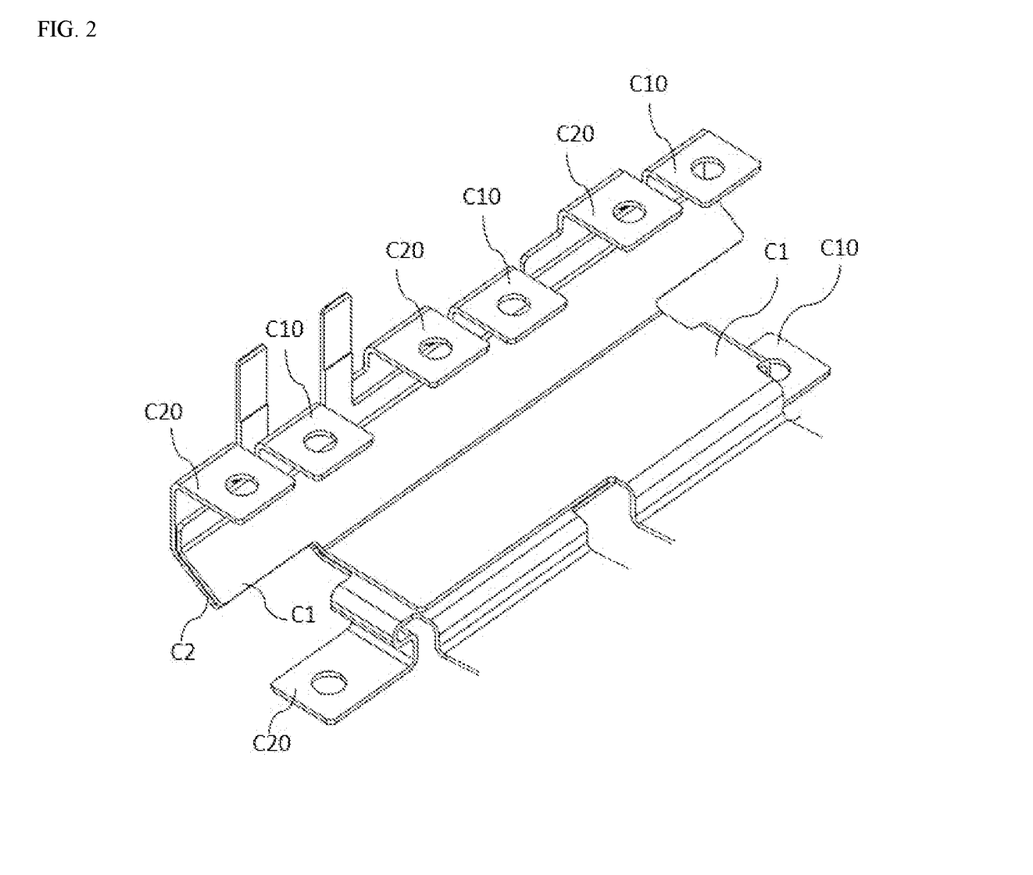
FIG. 2 illustrates the scheme of the conductors of the capacitive block illustrated in FIG. 1.

With reference to FIGS. 1 and 2, the capacitive block 12 also comprises at least two conductors C1, C2, disposed along distinct parallel planes but in the proximity of each other. In particular, conductors C1, C2 are superimposed with each other. A first conductor C1 is connected to the respective negative terminals of the capacitive elements 121, 122 of the capacitive block 12. A second conductor C2 is connected to the respective positive terminals of the capacitive elements 121, 122 of the capacitive block 12. To do so, the capacitive block 12 can comprise first welds S1 enabling the first conductor C1 and the negative terminals of the capacitive elements 121, 122 to be connected. In FIG. 1, the first conductor C1 is for example welded on a face of the first capacitive element 121. A portion of the first conductor C1 passes between the capacitive elements 121, 122 to come and connect to an opposite face of the second capacitive element 122. Similarly, the capacitive block 12 can comprise second welds S2 enabling the second conductor C2 and the positive terminals of the capacitive elements 121, 122 to be connected. In FIG. 1, the second conductor C2 is for example welded on a face of the second capacitive element 122. A portion of the second conductor C2 passes between the capacitive elements 121, 122 to come and connect to an opposite face of the first capacitive element 121.

Figure 6:
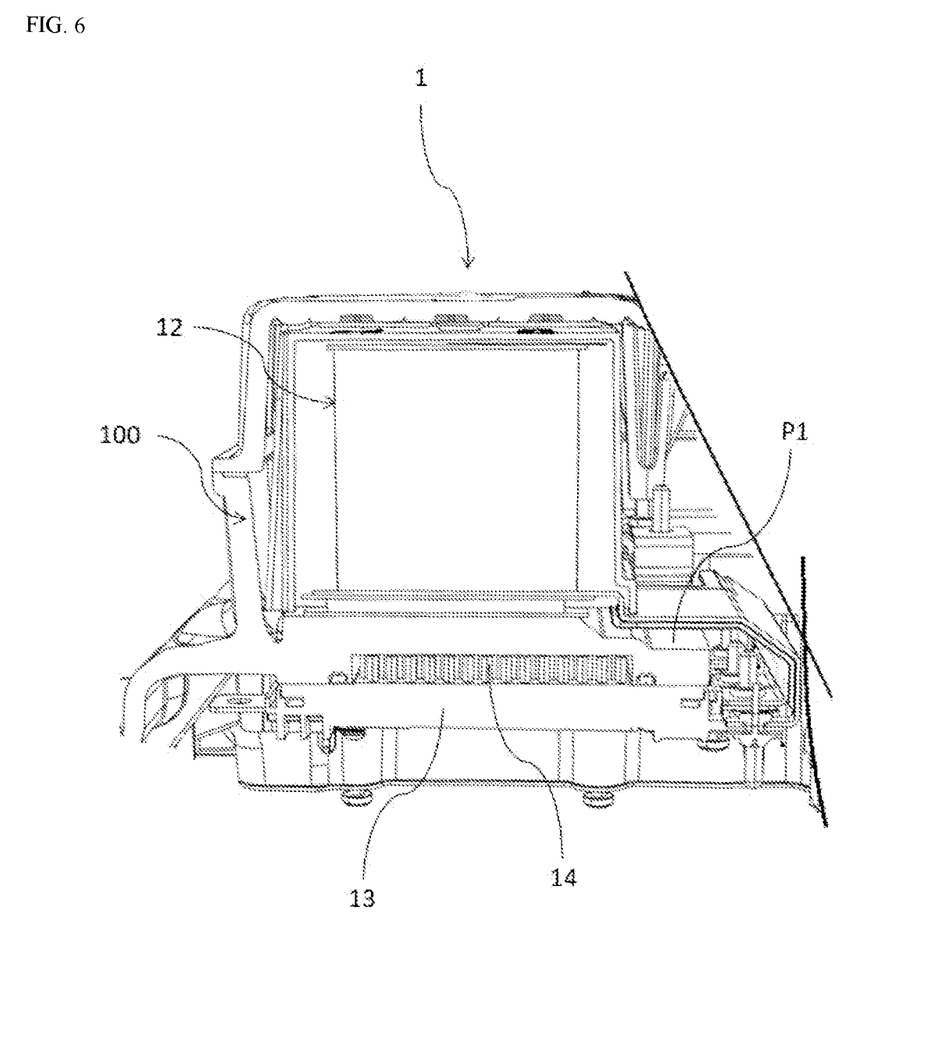
FIG. 6 represents an electrical equipment according to the invention.

Additionally, conductors C1, C2 are also located in the proximity of a wall P1 of said housing of the electrical equipment or in the proximity of other components that can be located in said housing of the electrical equipment. For example, as illustrated in FIG. 6, the electrical equipment 1, in the present case a power inverter, especially comprises a capacitive block 12 and an electronic power module 13 separated by a cooling circuit 14. Furthermore, the first conductor C1 is in the proximity of a wall P1 of the housing 100. Said wall P1 is especially included in a face of the cooling circuit 14 configured to cool components of the electrical equipment 1, in particular the capacitive block 12.

With reference to FIG. 2, each conductor C1, C2 respectively comprises at least one connecting terminal C10, C20 enabling the negative and positive terminals of the capacitive block 12 to be connected to the rest of the system in order especially to feed electric energy to the electric motor system. For example, the connection terminals C10, C20 of the conductors C1, C2 are connected to terminals of an electronic power module 13.

The connection terminals C10, C20 may for example designate a portion of the conductors C1, C2. In order to feed electric energy to other components, these portions are for example pierced with one or more ports, into which a connector is screwed. These portions can be connected to the connector by other means, for example through welding.

Figure 3:
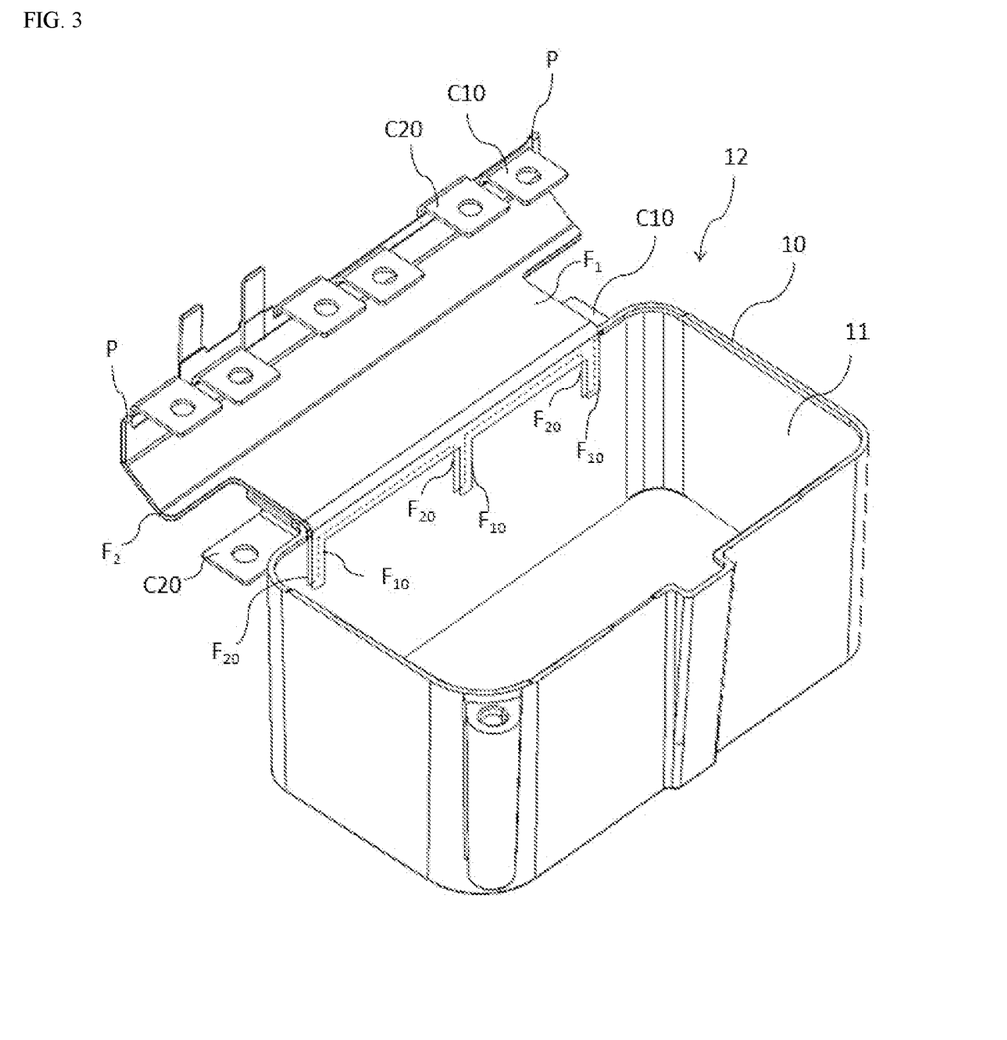
FIG. 3 represents the scheme of the casing of the capacitive block according to FIG. 1 and of an insulating film according to the invention.
Figure 4:
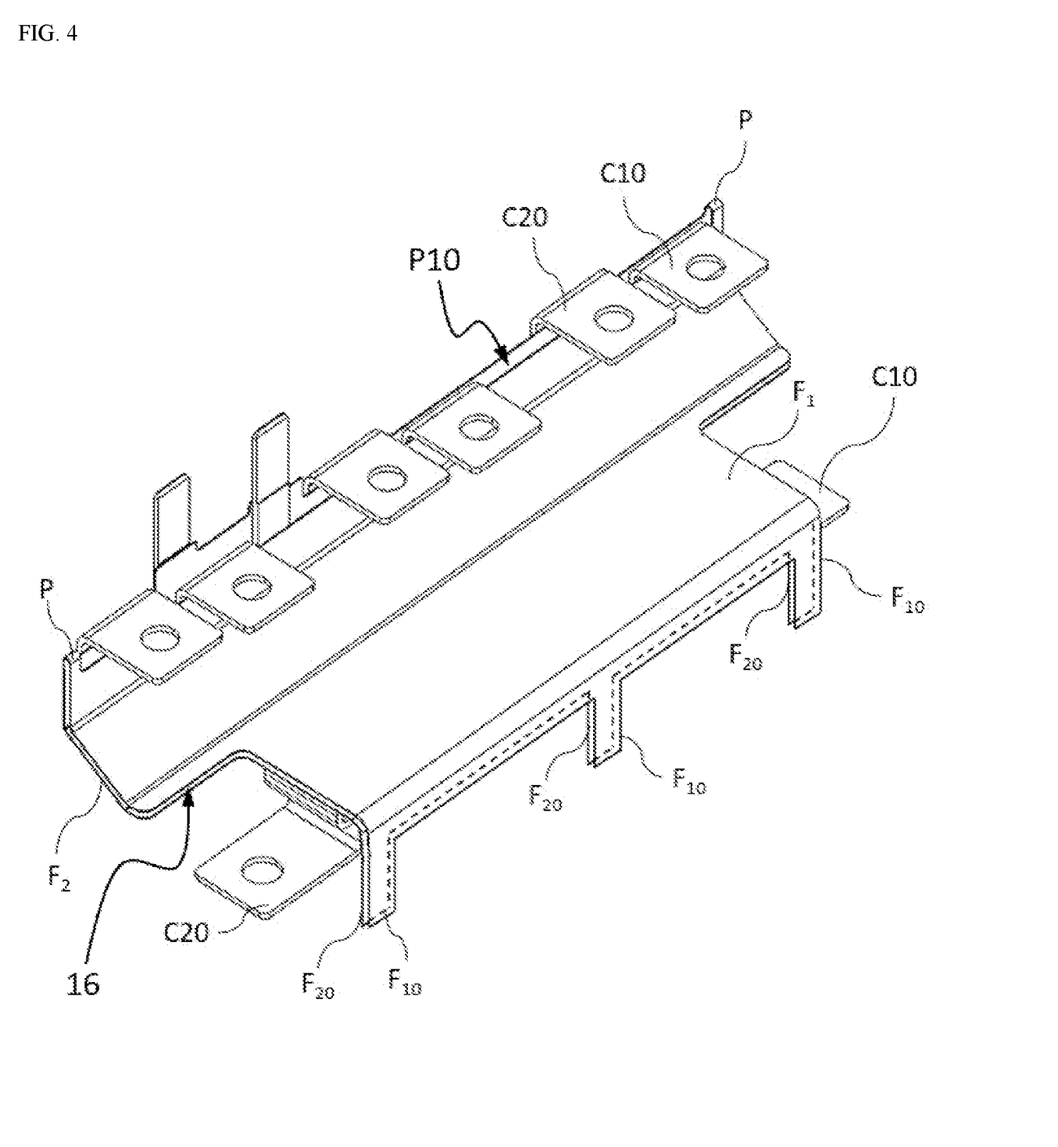
FIG. 4 represents the scheme of the conductors of the capacitive block illustrated in FIG. 1 and of the insulating film according to the invention.

With reference to FIGS. 3 and 4, in order to electrically insulate the conductors C1, C2 from the housing 100 and in order to electrically insulate the conductors C1, C2 from each other, and thus avoid any short-circuit, the capacitive block 12 also comprises an insulating film. Said insulating film designates a film folded on itself. The "first part F1" and "second part F2" designate each part of the insulating film located on either side of the fold P.

According to the form of embodiment set forth with reference to FIGS. 3 and 4, the first part F1 is adapted to be placed against the conductor among the at least two conductors C1, C2, closest to the housing 100, so as to electrically insulate this conductor from the rest of the housing 100. According to the set forth form of embodiment, the first part F1 is placed against the wall of the first conductor C1.

The first part F1 can be held and attached against the surface of this first conductor C1 in particular using an adhesive material 16 such as glue.

However, an adhesive material to hold the first part F1 of the insulating film against the surface of the first conductor C1 could be dispensed with. This is in particular the case when the insulating film is rigid enough to be folded before being mounted on said first conductor C1 and to preserve its shape once it is mounted on said first conductor C1. Thus, the lifetime of an adhesive material does not affect the service life of the capacitive block 12.

The end of the first part F1 directed towards the cavity 11 of the casing 10 comprises at least one protrusion F10. Said protrusion F10 designates a part projecting from the first part F1. This protrusion F10 is configured to extend into the cavity 11 of the casing 10 in order to be embedded and attached into the filling material 15 of the cavity 11 of the casing 10.

Additionally, given the position of the first part $F_1$, the second part $F_2$ is adapted to be inserted between said conductors C1, C2. In other words, the second part $F_2$ is held by being sandwiched between both conductors C1, C2 of the capacitive block 12. Said second part $F_2$ is configured to insulate said conductors C1, C2 from each other and avoid any short-circuit between them.

The end of the second part F2 directed towards the cavity 11 of the casing 10 comprises at least one protrusion F20. Said protrusion F20 designates a part projecting from the second part F2. This protrusion F20 is configured to extend into the cavity 11 of the casing 10 in order to be embedded and attached into the filling material 15 of the cavity 11 of the casing 10.

The fold P of the insulating film is configured so as to allow free access to the connection terminals C10, C20, said access enabling the connection terminals C10, C20 to be easily connected to the rest of the system in order in particular to feed electric energy to the electric motor system. For example, with reference to FIG. 4, the fold P comprises at least one aperture P10 allowing access to the connection terminals C10, C20.

The insulating film especially consists of a plastic material.

In particular, said filling material is fluid upon filling the cavity 11 of the casing 10, and then becomes solid after a polymerisation step. In particular, the filling material is a polymerisable substance, such as a polymerisable resin for example, especially an epoxy resin.

Thus, attaching and holding of the insulating film are provided on one side by the protrusions $F_{10}$, $F_{20}$ extending into the filling material and on one side by the fold P.

Figure 5:
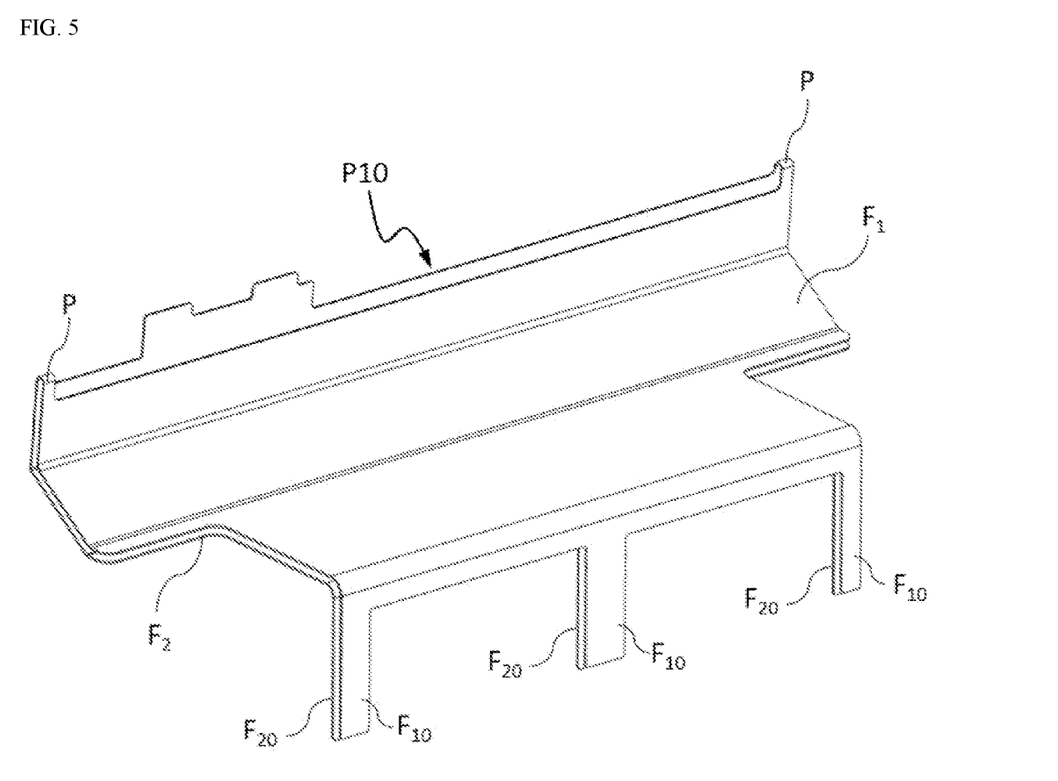
FIG. 5 represents the insulating film alone according to the invention.

With reference to FIG. 5, the insulating film is represented alone, comprising the first face $F_1$, the second face $F_2$ and their respective protrusions $F_{10}$, $F_{20}$.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. An electrical device comprising:
   a casing comprising a cavity receiving an electrical component, and
   at least two conductors connected to the electrical component so as to supply it with electric energy, both conductors being superimposed with each other and extending in parallel,
   wherein said electrical device comprises an electric insulating film folded on itself around a fold, a first part of the electric insulating film being located on a side of the fold and coming against a surface of the first conductor so as to electrically insulate it from a housing, and a second part of the electric insulating film being located on the opposite side of the fold and being inserted between both conductors so as to electrically insulate them from each other, the second part of the electric insulating film coming against another surface of the first conductor opposite to the surface of the first conductor receiving the first part of the electric insulating film.

2. The electrical device according to claim 1, wherein the fold of the electric insulating film comprises at least one aperture adapted to allow free access to the conductors.

3. The electrical device according to claim 1, wherein the first part and the second part of the electric insulating film each have at least one protrusion inserted into the cavity of the casing and embedded in a filling material of the cavity of the casing.

4. The electrical device according to claim 1, forming a capacitive block, and wherein the electrical component is a capacitive element.

5. The electrical device according to claim 1, wherein the first part is held on the surface of the first conductor through an adhesive material.

6. The electrical device according to claim 1, wherein the electric insulating film is made of plastic.

7. An electrical equipment comprising a housing and the electrical device according to claim 1 housed in said housing, the first part of the electric insulating film electrically insulating the first conductor from other components of the electrical equipment located in said housing of the electrical equipment, the second part of the electric insulating film, insulating the conductors from each other.

8. The electrical device according to claim 2, wherein the first part and the second part of the insulating film each have at least one protrusion inserted into the cavity of the casing and embedded in a filling material of the cavity of the casing.

9. The electrical device according to claim 2, forming a capacitive block, and wherein the electrical component is a capacitive element.

10. The electrical device according to claim 3, forming a capacitive block, and wherein the electrical component is a capacitive element.

11. The electrical device according to claim 3, wherein the first part of the electric insulating film is folded so as to fit the surface of the first conductor and is held against said surface of the first conductor only through the at least one protrusion and the fold.

12. The electrical device according to claim 2, wherein the first part is held on the surface of the first conductor through an adhesive material.

13. The electrical device according to claim 3, wherein the first part is held on the surface of the first conductor through an adhesive material.

14. The electrical device according to claim 4, wherein the first part is held on the surface of the first conductor through an adhesive material.

15. The electrical device according to claim 2, wherein the insulating film is made of plastic.

16. The electrical device according to claim 3, wherein the insulating film is made of plastic.

* * * * *